(12) United States Patent
Kugler et al.

(10) Patent No.: US 10,756,272 B2
(45) Date of Patent: Aug. 25, 2020

(54) METHOD AND COMPOSITION

(71) Applicant: Sumitomo Chemical Company Limited, Tokyo (JP)

(72) Inventors: Thomas Kugler, Godmanchester (GB); Florence Bourcet, Godmanchester (GB); Sheena Zuberi, Godmanchester (GB)

(73) Assignee: Sumitmoor Chemical Company Limited, Tokyo (JP)

( * ) Notice: Subject to any disclaimer, the term of this patent is extended or adjusted under 35 U.S.C. 154(b) by 0 days.

(21) Appl. No.: 16/314,310

(22) PCT Filed: Jun. 27, 2017

(86) PCT No.: PCT/GB2017/051873
§ 371 (c)(1),
(2) Date: Dec. 28, 2018

(87) PCT Pub. No.: WO2018/002604
PCT Pub. Date: Jan. 4, 2018

(65) Prior Publication Data
US 2019/0207111 A1   Jul. 4, 2019

(30) Foreign Application Priority Data
Jun. 28, 2016 (GB) .................. 1611189.0

(51) Int. Cl.
*H01L 51/00* (2006.01)
*H01L 51/56* (2006.01)

(52) U.S. Cl.
CPC ........ *H01L 51/002* (2013.01); *H01L 51/0039* (2013.01); *H01L 51/0043* (2013.01); *H01L 51/56* (2013.01)

(58) Field of Classification Search
None
See application file for complete search history.

(56) References Cited

U.S. PATENT DOCUMENTS

2004/0220332 A1   11/2004   Ho et al.
2011/0248267 A1   10/2011   Wei et al.

FOREIGN PATENT DOCUMENTS

WO   WO 2017/021712 A1   2/2017
WO   WO 2017/089811 A1   6/2017
WO   WO 2017/103610 A1   6/2017

(Continued)

OTHER PUBLICATIONS

International Search Report and Written Opinion for International Application No. PCT/GB2017/051873, dated Sep. 26, 2017.

(Continued)

*Primary Examiner* — Asok K Sarkar
(74) *Attorney, Agent, or Firm* — Wolf, Greenfield & Sacks, P.C.

(57) ABSTRACT

A method of forming an n-doped organic semiconductor, the method comprising: formation of an n-dopant reagent by reaction of a composition comprising two or more precursor units for forming the n-dopant reagent and an organic semiconductor; and n-doping the organic semiconductor. One or more of the precursor units may be a substituent of a polymeric repeat unit. The n-doped organic semiconductor may be an electron-injection layer of an organic light-emitting device.

18 Claims, 2 Drawing Sheets

(56) References Cited

FOREIGN PATENT DOCUMENTS

WO    WO 2017/141035 A1    8/2017

OTHER PUBLICATIONS

Combined Search and Examination Report for British Application No. GB1611189.0, dated May 3, 2017.
Bao, Air-Stable n-type Conductors and Semiconductors. Air Force Research Laboratory. https://apps.dtic.mil/dric/tr/fulltext/u2/a621167.pdf. Dated Jul. 14, 2015; last accessed Sep. 15, 2017. 19 pages.

METHOD AND COMPOSITION

RELATED APPLICATIONS

This Application is a national stage filing under 35 U.S.C. § 371 of international PCI application PCT/GB2017/051873, filed. Jun. 27, 2017, which claims priority to United. Kingdom patent application GB 1611189.0, filed Jun. 28, 2016, each of which is incorporated herein by reference in its entirety.

FIELD OF THE INVENTION

The invention relates to methods and compositions for forming n-doped organic semiconductors and organic electronic devices containing said n-doped semiconductors.

BACKGROUND OF THE INVENTION

Electronic devices containing organic semiconductor materials are known for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

n-doping and p-doping of organic semiconductors has been investigated, for example n-doping using metals with a low ionisation potential such as Li, Na or Cs as disclosed in, for example, physica status solidi (a), 1/2013. In the case of n-doping, a problem arises in that a low ionisation potential of the n-dopant is needed for an electron to be transferred from the n-dopant to the lowest unoccupied molecular orbital (LUMO) of the organic semiconductor. This low ionisation potential renders the n-dopant susceptible to degradation in air.

Bao et al, "Use of a 1H-Benzoimidazole Derivative as an n-Type Dopant and To Enable Air-Stable Solution-Processed n-Channel Organic Thin-Film Transistors" J. Am. Chem. Soc. 2010, 132, 8852-8853 discloses doping of [6,6]-phenyl $C_{61}$ butyric acid methyl ester (PCBM) by mixing (4-(1,3-dimethyl-2,3-dihydro-1H-benzoimidazol-2-yl)phenyl)dimethylamine (N-DMBI) with PCBM and activating the N-DMBI by heating.

US 2014/070178 discloses an OLED having a cathode disposed on a substrate and an electron-transporting layer formed by thermal treatment of an electron-transporting material and N-DMBI. It is disclosed that a radical formed on thermal treatment of N-DMBI may be an n-dopant.

U.S. Pat. No. 8,920,944 discloses n-dopant precursors for doping organic semiconductive materials.

Naab et al, "Mechanistic Study on the Solution-Phase n-Doping of 1,3-Dimethyl-2-aryl-2,3-dihydro-1H-benzoimidazole Derivatives", J. Am. Chem. Soc. 2013, 135, 15018-15025 discloses that n-doping may occur by a hydride transfer pathway or an electron transfer pathway.

Although N-DMBI has greater air stability than n-dopants such as alkali metals, it does still nevertheless undergo oxidation in the presence of molecular oxygen.

It is therefore an object of the invention to provide an n-doped organic semiconductor that may be formed from materials with higher air stability.

SUMMARY OF THE INVENTION

The present inventors have found that an n-dopant, or an n-doping reagent, can be formed in-situ by reaction of a precursor for forming the n-dopant or n-dopant precursor.

Accordingly, in a first aspect the invention provides a method of forming an n-doped organic semiconductor, the method comprising:

formation of an n-dopant reagent by reaction of a composition comprising two or more precursors for forming the n-dopant reagent and an organic semiconductor; and n-doping the organic semiconductor.

By "n-dopant reagent" as used herein is meant a material which, together with the organic semiconductor, forms an n-doped organic semiconductor either spontaneously upon contact of the organic semiconductor at room temperature (20° C.) or upon activation, optionally by heat or light activation.

A layer of an organic electronic device may be formed by the method of the first aspect by forming a precursor layer comprising or consisting of the n-dopant precursor units and the organic semiconductor, reacting the n-dopant precursor units to form the n-dopant reagent; and n-doping the organic semiconductor.

Accordingly, in a second aspect the invention provides a method of forming an organic electronic device wherein an n-doped organic semiconductor layer of the device is formed by forming a precursor layer comprising or consisting of the n-dopant reagent precursor units and the organic semiconductor, reacting the n-dopant precursor units to form the n-dopant reagent; and n-doping the organic semiconductor.

By forming the n-dopant reagent in-situ in the presence of the organic semiconductor, degradation of the n-dopant reagent before it dopes the organic semiconductor, for example by exposure of the n-dopant reagent to atmospheric oxygen and/or water, may be limited or avoided.

In a third aspect the invention provides a composition comprising the n-dopant reagent precursor units and the organic semiconductor. The n-dopant reagent precursor units and the organic semiconductor of this third aspect may be as described anywhere herein.

In a fourth aspect the invention provides a formulation comprising a composition according to the third aspect and at least one solvent.

DESCRIPTION OF THE DRAWINGS

The invention will now be described in more detail with reference to the drawings in which.

DETAILED DESCRIPTION OF THE INVENTION

Figure 1:
FIG. 1 illustrates schematically an OLED according to an embodiment of the invention.

The n-dopant as described herein is formed by reaction of two or more precursor units in the presence of an organic semiconductor.

Following formation of the n-dopant reagent, the organic semiconductor may be doped spontaneously on contact with the n-dopant reagent or n-doping may occur upon activation.

Precursor Units

The n-dopant reagent may be formed directly from reaction of the two or more precursor units or a product of the reaction of the precursor units may undergo one or more further reactions to form the n-dopant reagent.

Preferably, the precursor units react to form at least one carbon-nitrogen bond, preferably two carbon-nitrogen bonds.

Preferably, the two precursor units react in an elimination reaction, optionally a dehydration.

Preferably, the n-dopant reagent is a direct product of the reaction of two precursor units.

The n-dopant reagent may be formed by reaction of a first non-polymeric precursor compound P-1 comprising or consisting of the first precursor unit and a second non-polymeric precursor compound P-2 comprising or consisting of the second precursor unit.

The n-dopant reagent may be bound to one or more polymer backbones. Preferably, the n-dopant reagent is bound to one or two polymer backbones. In this case, formation of the n-dopant reagent may comprise reaction of a first precursor unit P-1 with a second precursor unit P-2 wherein at least one, optionally both, of P-1 and P-2 is a substituent of a polymeric repeat unit.

A first precursor polymer may comprise a repeat unit of formula (I), and a second precursor polymer may comprise a repeat unit of formula (II):

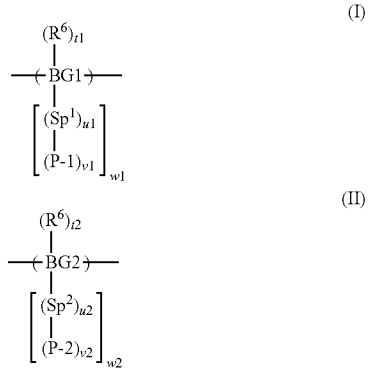

wherein BG1 and BG2 are, respectively, first and second backbone groups; $Sp^1$ and $Sp^2$ are, respectively, first and second spacer groups; P-1 and P-2 are, respectively, first and second precursor units; $R^6$ is a substituent; t1 and t2 are each independently 0 or a positive integer; u1 and u2 are each independently 0 or 1; v1 and v2 are each independently 1 if u1 or u2 respectively is 0; v1 and v2 are each independently at least 1 if u is 1; and w1 and w2 are each independently at least 1.

The n-dopant reagent may be formed by reacting a first precursor polymer comprising a repeat unit of formula (I) with a non-polymeric precursor compound P-2 to form a polymer comprising a repeat unit of formula (III) substituted with the n-dopant reagent:

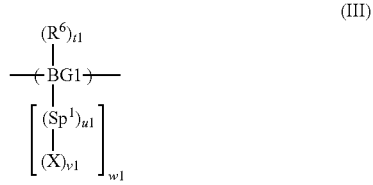

wherein BG1, $Sp^1$, $R^6$, u1, v1 and w1 are as described above and X is the n-dopant reagent.

The n-dopant reagent may be formed by reacting a second precursor polymer comprising a repeat unit of formula (II) with a non-polymeric precursor compound P-1 to form a polymer comprising a repeat unit of formula (IV) substituted with the n-dopant reagent:

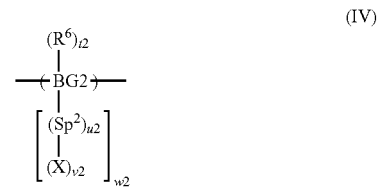

wherein BG2, $Sp^2$, $R^6$, u2, v2 and w2 are as described above and X is an n-dopant reagent.

The n-dopant reagent may be formed by reacting a repeat unit of formula (I) with a repeat unit of formula (II).

Optionally, a first precursor polymer comprising a repeat unit of formula (I) is reacted with a second precursor polymer comprising a repeat unit of formula (II) to form a polymer wherein the n-dopant reagent is bound to polymer backbones of both the first and second precursor polymers.

Optionally, the n-dopant reagent is formed by reacting a polymer precursor comprising both a repeat unit of formula (I) and a repeat unit of formula (II). Precursor repeat units of the same polymer chain may undergo an intra-polymeric reaction with each other or may react with repeat units of other polymer chains comprising a repeat unit of formula (I) and/or (II).

Optionally, the n-dopant reagent is formed by reacting a polymer precursor comprising a repeat unit of formula (VI):

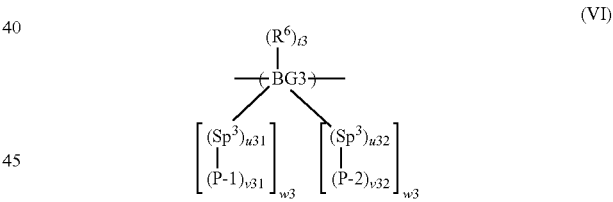

wherein BG3 is a backbone group; $Sp^3$ in each occurrence is independently a spacer group; P-1 and P-2 are, respectively, first and second precursor units; $R^6$ is a substituent; t3 is 0 or a positive integer; u31 is 0 or 1; u32 is 0 or 1; v31 is 1 if u31 is 0; v31 is at least 1 if u31 is 1; v32 is 1 if u32 is 0; v32 is at least 1 if u32 is 1; and w3 independently in each occurrence is at least 1, optionally 1, 2 or 3.

Optionally, the n-dopant reagent is formed by reacting a polymer precursor comprising a repeat unit of formula (VI). Precursor repeat units of the same polymer chain, or groups P-1 and P-2 of the same repeat unit, may undergo an intra-polymeric reaction with each other or may react with precursor repeat units of other polymer chains.

Optionally, $Sp^1$, $Sp^2$ and $Sp^3$ are each independently selected from:

$C_{1-20}$ alkylene wherein one or more non-adjacent C atoms may be replace with unsubstituted or substituted phenylene, unsubstituted or substituted biphenylene, O, S, C=O or COO; and arylene or heteroarylene, preferably phenylene, that may be unsubstituted or substituted.

"$C_{1-20}$ alkylene" as used herein means a divalent carbon atom or divalent alkyl chain.

Optionally, arylene or heteroarylene groups of $Sp^1$, $Sp^2$ or $Sp^3$ are selected from phenylene and 5 or 6 membered heteroarylene groups. If present, substituents of arylene or heteroarylene groups of $Sp^1$ or $Sp^2$ are preferably selected from $C_{1-20}$ alkyl groups wherein one or more non-adjacent, non-terminal C atoms of the $C_{1-20}$ alkyl groups may be replaced with O, S, C=O or COO, more preferably $C_{1-12}$ alkyl.

By "non-terminal C atom" of an alkyl group as used herein is meant a carbon atom other than the methyl group at the end of an n-alkyl chain or a methyl group at an end of a branched alkyl group.

Optionally, $Sp^1$, $Sp^2$ and $Sp^3$ are independently selected from the group consisting of $C_{1-20}$ alkylene, $C_{1-20}$ alkoxylene, $C_{1-20}$ oxyalkylene, phenylene-$C_{1-20}$ alkylene, phenylene-$C_{1-20}$ alkoxylene and phenylene-$C_{1-20}$ oxyalkylene wherein the phenylene group is unsubstituted or substituted, optionally substituted with one or more $C_{1-12}$ alkyl groups.

Substituents $R^6$, if present, may be the same or different in each occurrence and are optionally selected from the group consisting of:

D;

alkyl, optionally $C_{1-20}$ alkyl, wherein one or more non-adjacent C atoms may be replaced with a group selected from: $C_{6-20}$ aryl or $C_{6-20}$ arylene, optionally phenylene, that is unsubstituted or substituted with one or more substituents, 5-20 membered heteroaryl or 5-20 membered heteroarylene that is unsubstituted or substituted with one or more substituents, O, S, C=O or —COO;

a group of formula —$(Ar^1)_n$— wherein $Ar^1$ in each occurrence is independently a $C_{6-20}$ aryl or 5-20 membered heteroaryl group that is unsubstituted or substituted with one or more substituents and n is at least 1, optionally 1, 2 or 3; and ionic substituents.

Substituents $R^6$ may be selected according to a desired solubility of the polymer.

Preferred substituents for solubility of the polymer in polar solvents are substituents containing one or more ether groups, optionally a substituent comprising a group of formula —$O(CH_2CH_2O)_n$—$CH_3$ wherein n is at least 1, optionally an integer from 1 to 10; groups of formula —$COOR^{10}$ wherein $R^{10}$ is a $C_{1-5}$ alkyl group; and ionic substituents. Ionic substituents $R^6$ may be cationic or anionic.

Exemplary anionic substituents comprise formula —COO— with a suitable metal or organic cation. Exemplary metal cations are alkali metal cations, preferably Cs+. Exemplary organic cations are ammonium, optionally tetraalkylammonium, ethylmethyl, imidazolium and pyridinium. Exemplary cationic substituents comprise quaternary ammonium with a suitable anion, optionally halide or sulfonate group, optionally mesylate or tosylate.

A polymer comprising ester substituents may be converted to a polymer comprising substituents formula —$COO^-M^+$ wherein $M^+$ is a metal cation. The conversion may be as described in WO 2012/133229, the contents of which are incorporated herein by reference.

Other preferred substituents $R^6$ include $C_{1-40}$ hydrocarbyl groups, optionally $C_{1-20}$ alkyl; unsubstituted phenyl; and phenyl substituted with one or more $C_{1-12}$ alkyl groups.

An aryl, arylene, heteroaryl or heteroarylene group of a substituent $R^6$ may be unsubstituted or substituted with one or more substituents. Substituents, where present, may selected from $C_{1-20}$ alkyl wherein one or more non-adjacent C atoms may be replaced with O, S, C=O or —COO—, more preferably $C_{1-20}$ alkyl.

The first precursor polymer comprising repeat units of formula (I), the second precursor polymer comprising repeat units of formula (II), a precursor polymer comprising both repeat units of formulae (I) and (II) or a precursor polymer comprising repeat units of formula (VI) may each independently be a conjugated or non-conjugated polymer. By "conjugated polymer" is meant a polymer comprising repeat units in the polymer backbone that are directly conjugated to adjacent repeat units.

In the case of a conjugated polymer, BG1, BG2 and BG3 are each optionally a $C_{6-20}$ arylene repeat unit conjugated to arylene or heteroarylene groups of adjacent repeat units.

The first precursor polymer may comprise repeat units of formula (I) and one or more co-repeat units, optionally one or more $C_{6-20}$ arylene co-repeat units, each of which may be unsubstituted or substituted with one or more substituents, optionally one or more substituents $R^6$.

The second precursor polymer may comprise repeat units of formula (II) and one or more co-repeat units, optionally one or more $C_{6-20}$ arylene co-repeat units, each of which may be unsubstituted or substituted with one or more substituents, optionally one or more substituents $R^6$.

A precursor polymer comprising repeat units of formulae (I) and (II) may comprise one one or more co-repeat units, optionally one or more $C_{6-20}$ arylene co-repeat units, each of which may be unsubstituted or substituted with one or more substituents, optionally one or more substituents $R^6$ A precursor polymer comprising repeat units of formula (VI) may comprise one or more co-repeat units, optionally one or more $C_{6-20}$ arylene co-repeat units, each of which may be unsubstituted or substituted with one or more substituents, optionally one or more substituents $R^6$ Arylene groups BG1, BG2, BG3 and/or arylene co-repeat units include, without limitation, fluorene, phenylene, naphthalene, anthracene, indenofluorene, phenanthrene and dihydrophenanthrene repeat units.

Arylene groups BG1, BG2, BG3 and/or arylene co-repeat units may be selected from repeat units of formulae (IX)-(XII):

(IX)

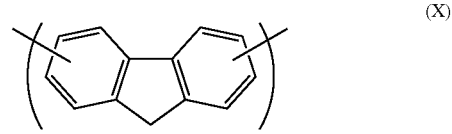

(X)

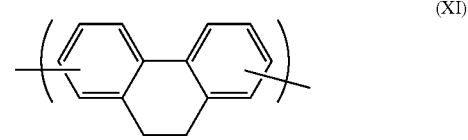

(XI)

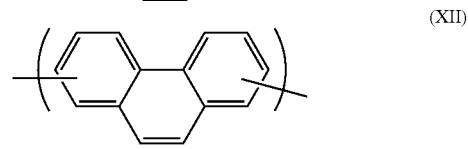

(XII)

Preferred repeat units of formula (I) have the following formulae:

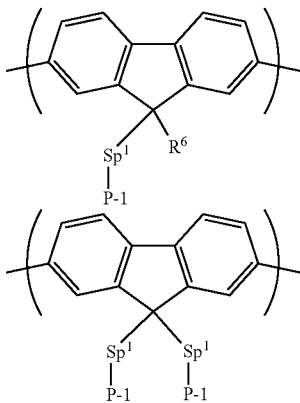

Preferred repeat units of formula (II) have the following formulae:

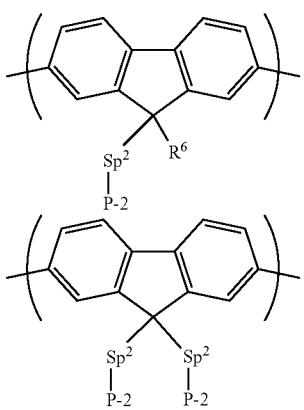

Preferred arylene co-repeat units have the following formulae:

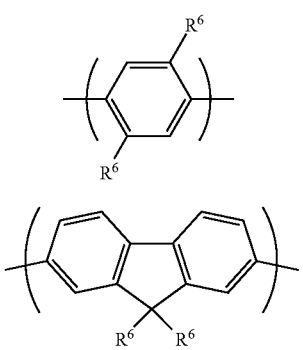

The substituent or substituents $R^6$ of a repeat unit of formula (I), (II) and/or of a further repeat unit may be selected according to the required solubility of the polymer.

Preferably, the n-dopant reagent has formula (V) and is formed according to Scheme 1 wherein the unit of formula (VII) is a precursor unit P-1 and the unit of formula (VIII) is a precursor unit P-2:

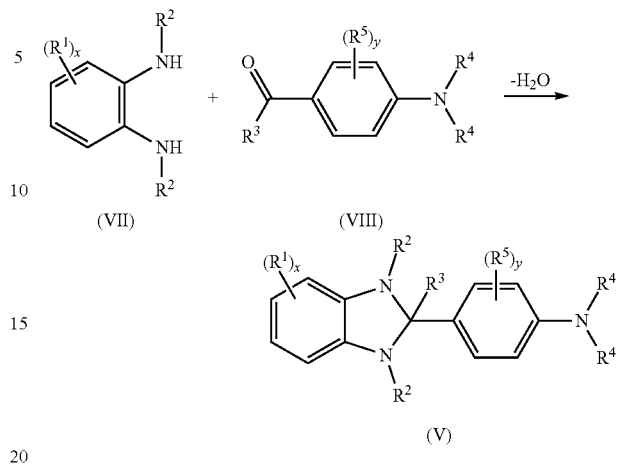

wherein:

$R^1$, $R^2$, $R^3$, $R^4$ and $R^5$ are each independently H or a substituent, or one or two of $R^1$-$R^5$ is a direct bond linking the group of formula (VII) or (VIII) to a polymeric backbone and the remaining groups $R^1$, $R^2$, $R^3$, $R^4$ and $R^5$ are each independently H or a substituent;

x is 0, 1, 2, 3 or 4; and
y is 0, 1, 2, 3 or 4.

In the case where the n-dopant reagent is a non-polymeric compound, each of $R^1$, $R^2$, $R^3$, $R^4$ or $R^5$ is independently H or a substituent.

In the case where the n-dopant reagent is a substituent of a polymeric repeat unit, one group selected from $R^1$, $R^2$, $R^3$, $R^4$ or $R^5$ is bound to a polymeric backbone and the other groups $R^1$, $R^2$, $R^3$, $R^4$ or $R^5$ are independently H or a substituent.

In the case where the n-dopant reagent is formed by reaction of a first precursor polymer and a second precursor polymer, or by intra- or inter-polymeric reaction of a single precursor polymer, one group selected from R and $R^2$ and one group selected from $R^3$, $R^4$ and $R^5$ are bound to polymeric backbones and the other groups $R^1$, $R^2$, $R^3$, $R^4$ or $R^5$ are independently H or a substituent.

In the case where one or two groups $R^1$, $R^2$, $R^3$, $R^4$ and $R^5$ are a linking group to a polymeric backbone, $R^1$ or $R^2$ may be a group $Sp^1$ and $R^3$, $R^4$ or $R^5$ may be a group $Sp^2$ as described above. Preferably, x is at least 1. Optionally x is 1 and one $R^1$ group is a direct bond to BG1 or, if present, $Sp^1$. Preferably, one $R^4$ group is a direct bond to BG2 or, if present, $Sp^2$.

The groups $R^1$-$R^5$ may be selected according to a desired solubility of a precursor in a solvent.

Optionally, substituents $R^1$-$R^5$ in each occurrence are independently selected from $C_{1-30}$ hydrocarbyl groups and ionic groups.

Preferred $C_{1-30}$ hydrocarbyl groups are $C_{1-20}$ alkyl; and a group of formula —$(Ar^2)_h$ wherein $Ar^2$ is a $C_{6-20}$ aryl group, preferably phenyl, h is 1, 2 or 3, and wherein each $Ar^2$ is independently unsubstituted or substituted with one or more $C_{1-12}$ alkyl groups.

Exemplary ionic groups $R^1$-$R^5$ are groups comprising or consisting of —COO$^-$M$^+$ wherein M$^+$ is an alkali cation or an ammonium cation, or groups comprising or consisting of —NR$^{11}_3{}^+$A$^-$ wherein R$^{11}$ in each occurrence is H or $C_{1-12}$ hydrocarbyl and A– is an anion, optionally a halide or sulfonate group.

Preferably, $R^3$ is H.

$R^5$, if present, is optionally a $C_{1-20}$ hydrocarbyl group. Preferably, y is 0.
Exemplary repeat units of formula (I) include the following:
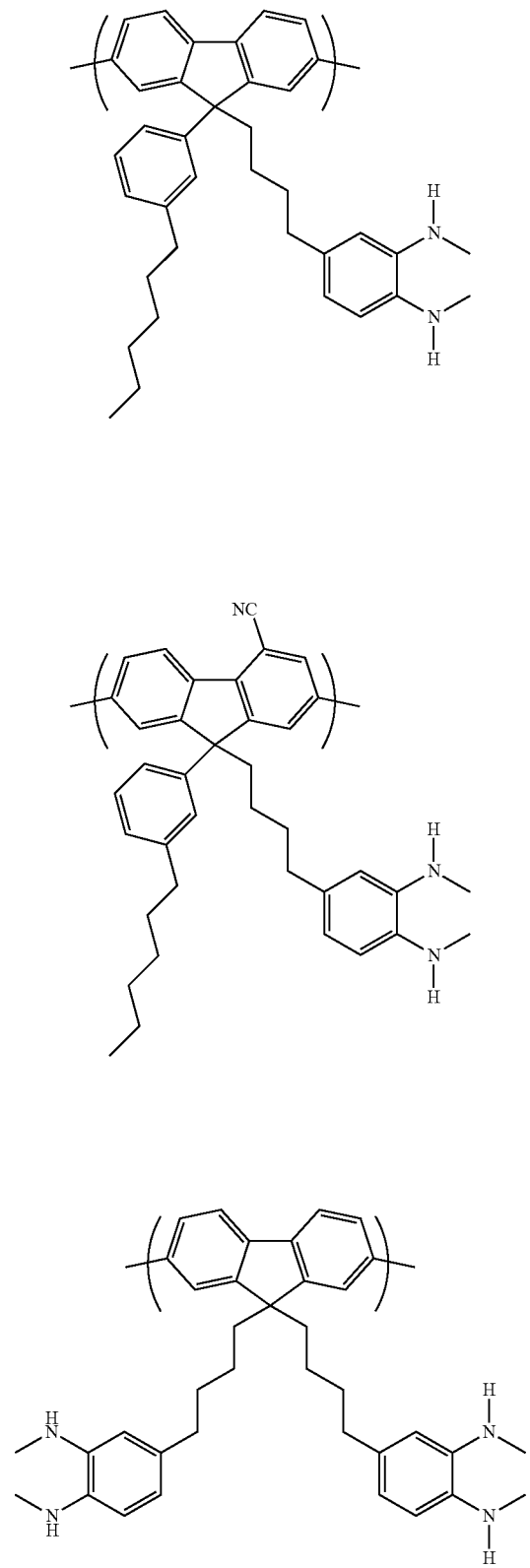
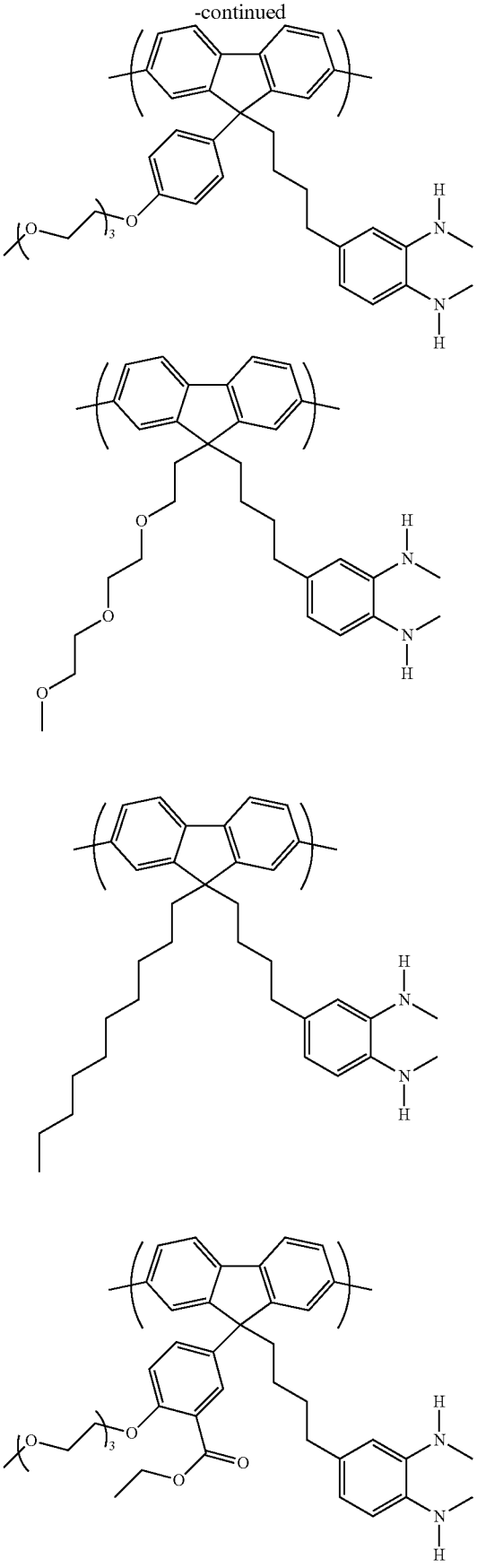
-continued

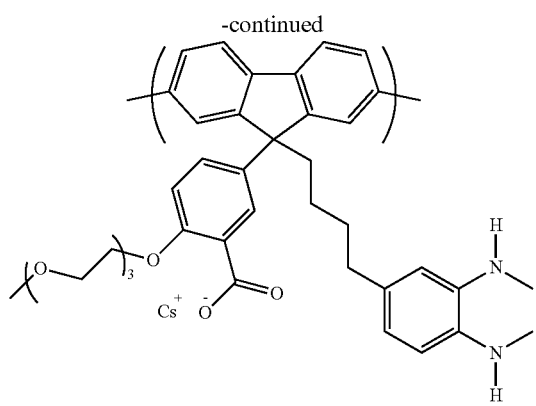
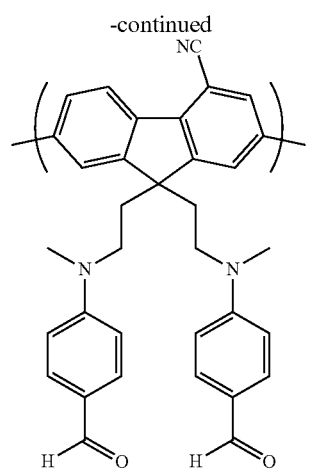
Exemplary repeat units of formula (II) include the following:
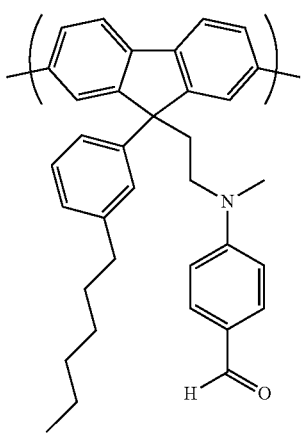
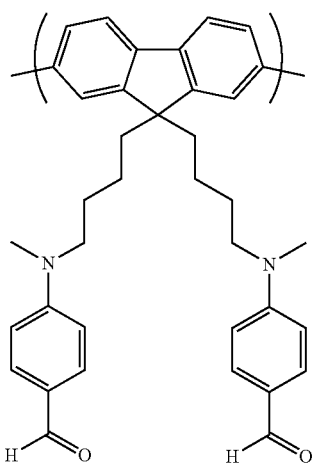
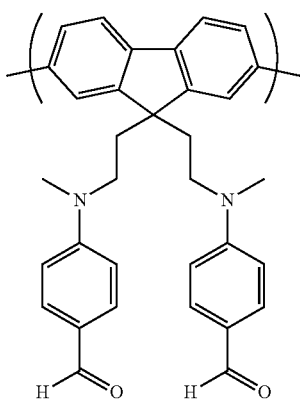
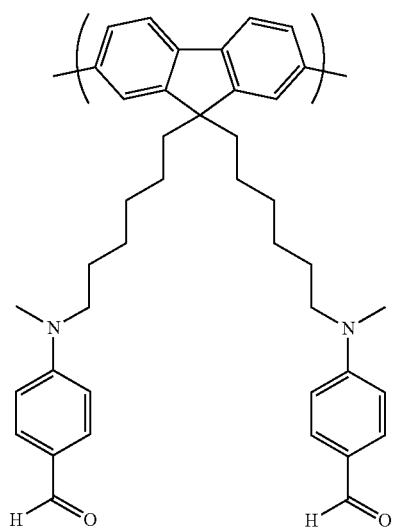

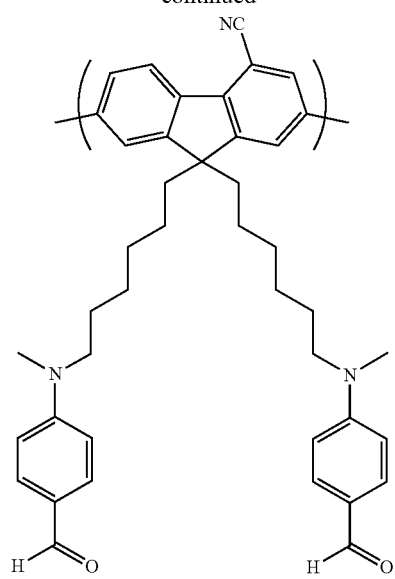
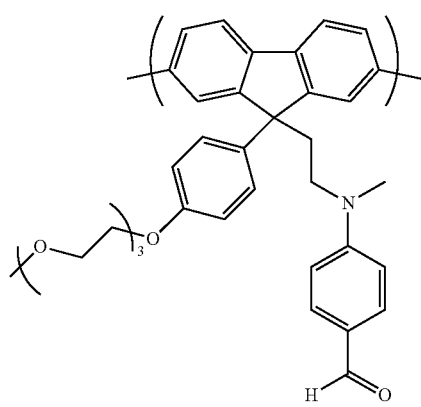
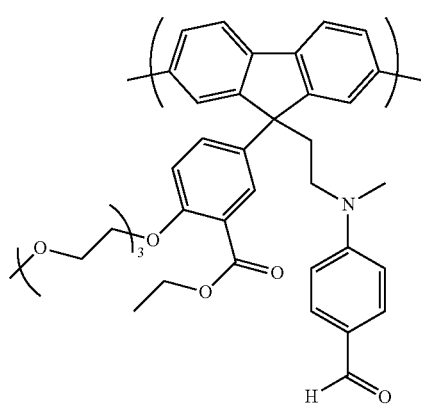
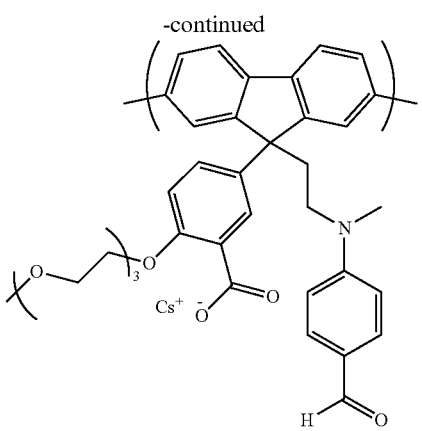
An exemplary repeat unit of formula (VI) has the following formula:

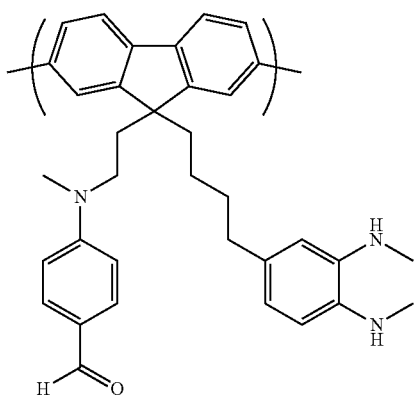

n-Dopant Reagent Formation

The precursor units are reacted in the presence of the organic semiconductor. The reaction is preferably carried out in the absence of a solvent that is liquid at atmospheric pressure and at 20° C.

The or each material of the composition to be reacted preferably is in the solid state at room temperature. The reaction may be carried out by forming a solid-state composition comprising or consisting of the organic semiconductor and the precursor units in powder form and heating the composition. The reaction temperature is optionally at least 50° C., at least 70° C. or at least 100° C. The reaction temperature is preferably less than 200° C. The precursor units may be substituents of the organic semiconductor, in which case the composition may be a single material, or the composition may comprise a mixture of materials, optionally an organic semiconductor mixed with a material comprising the first and second precursor units, or an organic semiconductor mixed with a material comprising the first precursor unit and a material comprising the second precursor unit.

If one or both of the precursor units is a substituent of a precursor polymer or if the organic semiconductor is a polymer then the reaction is preferably carried out at a temperature in excess of the glass transition temperature of the polymer of the composition, or in excess of the glass transition temperature of at least one of the polymers of the composition. The composition may form a melt upon heating.

It will be appreciated that some of the precursor units in the composition may not react to form the n-dopant reagent and that the product may therefore comprise residual, unreacted precursor units. Preferably, each precursor unit has a LUMO level that is the same as or shallower than the LUMO level of the organic semiconductor. This may avoid electron-trapping by a residual precursor unit.

In the case where the composition is a mixture of materials, the organic semiconductor:precursors weight ratio in the reaction mixture is optionally in the range 99:1-10:90. Optionally the precursors:organic semiconductor weight ratio is greater than 50:50.

Organic Electronic Device

The n-doped organic semiconductor may form a layer of an organic electronic device.

The organic electronic device is preferably an OLED comprising an anode, a cathode, a light-emitting layer between the anode and the cathode and an electron-injection layer comprising the n-doped organic semiconductor between the light-emitting layer and the cathode.

FIG. 1, which is not drawn to any scale, illustrates an OLED 100 according to an embodiment of the invention supported on a substrate 101, for example a glass or plastic substrate. The OLED 100 comprises an anode 103, a light-emitting layer 105, an electron-injecting layer 107 and a cathode 109.

One or more further layers may be provided between the anode and the cathode including, without limitation, one or more of: a hole-injection layer between the anode and the light-emitting layer; a hole-transporting layer between the anode and the light-emitting layer; an electron-blocking layer between the anode and the light-emitting layer; an electron-transporting layer between the cathode and the light-emitting layer; and a hole-blocking layer between the cathode and the light-emitting layer.

Preferably, one or both of a hole-transporting layer and a hole-injection layer is present.

Formation of the OLED may comprise the steps of forming a precursor layer comprising or consisting of the precursor units and the organic semiconductor over the light-emitting layer; forming a cathode over the precursor layer; reacting the precursor units to form the n-dopant reagent; and doping the organic semiconductor to form the electron-injection layer.

The components of the precursor layer may be deposited by any method including, without limitation, thermal evaporation and deposition of a formulation comprising a solvent wherein each component of the precursor layer is dissolved or dispersed in the solvent. The "solvent" of a formulation as described herein may consist of a single solvent material or may be a mixture of two or more solvent materials.

Optionally, the precursor layer is formed by depositing the formulation in air.

The solvent of the formulation may be selected to avoid dissolution of the underlying layer, preferably the light-emitting layer. Preferably, the precursor layer is deposited from a formulation wherein the or each solvent is a polar solvent.

Preferably, the precursor layer is formed on the light-emitting layer to form an electron-transporting layer that is adjacent to the light-emitting layer.

The cathode, and any intervening layer or layers that may be present between the cathode and the light-emitting layer, are preferably formed before reaction of the precursor units to form the n-dopant reagent. The device may be encapsulated following formation of the cathode, and prior to reaction of the precursor units.

In another arrangement, the reaction of the precursor units to form the n-dopant reagent is carried out before formation of the cathode.

The anode 103 may be single layer of conductive material or may be formed from two or more conductive layers. Anode 103 may be a transparent anode, for example a layer of indium-tin oxide. A transparent anode 103 and a transparent substrate 101 may be used such that light is emitted through the substrate. The anode may be opaque, in which case the substrate 101 may be opaque or transparent, and light may be emitted through a transparent cathode 109.

Light-emitting layer 105 contains at least one light-emitting material. Light-emitting layer 105 may contain only one compound that emits light when the device is in use or it may contain a mixture of more than one compound, optionally a host doped with one or more light-emitting dopants. Light-emitting layer 105 may contain at least one light-emitting material that emits phosphorescent light when the device is in operation, or at least one light-emitting material that emits fluorescent light when the device is in operation. Light-emitting layer 105 may contain at least one phosphorescent light-emitting material and at least one fluorescent light-emitting material.

Electron-injecting layer 107 comprises or consists of a charge-transfer complex formed from the organic semiconductor and the n-dopant reagent.

Cathode 109 is formed of at least one layer, optionally two or more layers, for injection of electrons into the device.

Preferably, the electron-injecting layer 107 is in contact with organic light-emitting layer 105. Preferably, the film comprising the organic semiconductor and n-dopant is formed directly on organic light-emitting layer 105.

Preferably, the organic semiconductor has a LUMO as measured by square wave voltammetry that is no more than about 1 eV, optionally less than 0.5 eV or 0.2 eV, deeper (i.e. further from vacuum) than a LUMO of a material of the light-emitting layer, which may be a LUMO of a light-emitting material or a LUMO of a host material if the light-emitting layer comprises a mixture of a host material and a light-emitting material. Optionally, the doped organic semiconductor has a work function that is about the same as a LUMO of a material of the light-emitting layer. Optionally, the organic semiconductor has a LUMO of less (i.e. closer to vacuum) than 3.0 eV from vacuum level, optionally around 2.1 to 2.8 eV from vacuum level. Preferably, the organic semiconductor has a LUMO level of up to 2.2 or 2.3 eV below the vacuum level.

Preferably, the cathode 109 is in contact with the electron-injecting layer 107.

Preferably, the cathode is formed directly on the precursor film comprising the organic semiconductor and the precursor compounds.

The OLED 100 may be a display, optionally a full-colour display wherein the light-emitting layer 105 comprises pixels comprising red, green and blue subpixels.

The OLED 100 may be a white-emitting OLED. White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K. A white-emitting OLED may contain a plurality of light-emitting materials, preferably red, green and blue light-emitting materials, more preferably red, green and blue phosphorescent light-emitting materials, that combine to produce white light. The light-emitting materials may all be provided in light-emitting layer 105, or one or more additional light-emitting layers may be provided.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm.

A blue light-emitting material may have a photoluminescence spectrum with a peak in the range of up to about 490 nm, optionally about 450-490 nm.

The photoluminescence spectrum of a material may be measured by casting 5 wt % of the material in a PMMA film onto a quartz substrate and measuring in a nitrogen environment using apparatus C9920-02 supplied by Hamamatsu.

Light-Emitting Layers

The OLED 100 may contain one or more light-emitting layers.

Light-emitting materials of the OLED 100 may be fluorescent materials, phosphorescent materials or a mixture of fluorescent and phosphorescent materials. Light-emitting materials may be selected from polymeric and non-polymeric light-emitting materials. Exemplary light-emitting polymers are conjugated polymers, for example polyphenylenes and polyfluorenes examples of which are described in Bernius, M. T., Inbasekaran, M., O'Brien, J. and Wu, W., Progress with Light-Emitting Polymers. Adv. Mater., 12 1737-1750, 2000, the contents of which are incorporated herein by reference. Light-emitting layer 107 may comprise a host material and a fluorescent or phosphorescent light-emitting dopant. Exemplary phosphorescent dopants are row 2 or row 3 transition metal complexes, for example complexes of ruthenium, rhodium, palladium, rhenium, osmium, iridium, platinum or gold.

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission. A plurality of light-emitting layers may together produce white light.

A fluorescent light-emitting layer may consist of a light-emitting material alone or may further comprise one or more further materials mixed with the light-emitting material. Exemplary further materials may be selected from hole-transporting materials; electron-transporting materials and triplet-accepting materials, for example a triplet-accepting polymer as described in WO 2013/114118, the contents of which are incorporated herein by reference.

Cathode

The cathode may comprise one or more layers. Preferably, the cathode comprises or consists of a layer in contact with the electron injecting layer that comprises or consists of one or more conductive materials. Exemplary conductive materials are metals, preferably metals having a work function of at least 4 eV, optionally aluminium, copper, silver or gold or iron. Exemplary non-metallic conductive materials include conductive metal oxides, for example indium tin oxide and indium zinc oxide, graphite and graphene. Work functions of metals are as given in the CRC Handbook of Chemistry and Physics, 12-114, 87$^{th}$ Edition, published by CRC Press, edited by David R. Lide. If more than one value is given for a metal then the first listed value applies.

The or each layer of the cathode may be deposited by any suitable method including, without limitation, thermal evaporation, sputtering and printing. Reaction of a first and second precursor polymer may form a crosslinked electron-injection layer onto which a cathode may be printed without dissolution of the electron injection layer.

The cathode may be opaque or transparent. Transparent cathodes are particularly advantageous for active matrix devices because emission through a transparent anode in such devices is at least partially blocked by drive circuitry located underneath the emissive pixels.

It will be appreciated that a transparent cathode device need not have a transparent anode (unless a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Hole-Transporting Layer

A hole transporting layer may be provided between the anode 103 and the light-emitting layer 105.

The hole-transporting layer may be cross-linked, particularly if an overlying layer is deposited from a solution. The crosslinkable group used for this crosslinking may be a crosslinkable group comprising a reactive double bond such and a vinyl or acrylate group, or a benzocyclobutane group. Crosslinking may be performed by thermal treatment, preferably at a temperature of less than about 250° C., optionally in the range of about 100-250° C.

A hole transporting layer may comprise or may consist of a hole-transporting polymer, which may be a homopolymer or copolymer comprising two or more different repeat units. The hole-transporting polymer may be conjugated or non-conjugated. Exemplary conjugated hole-transporting polymers are polymers comprising arylamine repeat units, for example as described in WO 99/54385 or WO 2005/049546 the contents of which are incorporated herein by reference. Conjugated hole-transporting copolymers comprising arylamine repeat units may have one or more co-repeat units selected from arylene repeat units, for example one or more repeat units selected from fluorene, phenylene, phenanthrene naphthalene and anthracene repeat units, each of which may independently be unsubstituted or substituted with one or more substituents, optionally one or more $C_{1-40}$ hydrocarbyl substituents.

If present, a hole transporting layer located between the anode and the light-emitting layer 105 preferably has a HOMO level of 5.5 eV or shallower (closer to vacuum), more preferably around 4.8-5.5 eV or 5.1-5.3 eV as measured by square wave voltammetry. The HOMO level of the hole transport layer may be selected so as to be within 0.2 eV, optionally within 0.1 eV, of an adjacent layer in order to provide a small barrier to hole transport between these layers.

Preferably a hole-transporting layer, more preferably a crosslinked hole-transporting layer, is adjacent to the light-emitting layer 105.

A hole-transporting layer may consist essentially of a hole-transporting material or may comprise one or more further materials. A light-emitting material, optionally a phosphorescent material, may be provided in the hole-transporting layer.

A phosphorescent material may be covalently bound to a hole-transporting polymer as a repeat unit in the polymer backbone, as an end-group of the polymer, or as a side-chain of the polymer. If the phosphorescent material is provided in a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO.

Emission from a light-emitting hole-transporting layer and emission from light-emitting layer 105 may combine to produce white light.

Hole Injection Layers

A conductive hole injection layer, which may be formed from a conductive organic or inorganic material, may be provided between the anode 103 and the light-emitting layer 105 of an OLED as illustrated in FIG. 1 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Organic Semiconductor

The organic semiconductor and the n-dopant reagent form an n-doped organic semiconductor either spontaneously on contact of the organic semiconductor and the n-dopant or upon activation. If no, or limited, spontaneous n-doping occurs then the extent of n-doping may be increased by activation.

Preferably, there is little or no spontaneous doping of the organic semiconductor upon contact with the n-dopant reagent at room temperature. Preferably, the extent of n-doping is increased upon activation. Optionally, the n-dopant reagent has a HOMO level as measured by square wave voltammetry that is the same as or, preferably, deeper (further from vacuum) than the LUMO level of the organic semiconductor as measured by square wave voltammetry, optionally at least 1 eV or 1.5 eV deeper than the LUMO level of the organic semiconductor.

The organic semiconductor may be a polymeric or non-polymeric material. Optionally, the organic semiconductor is a polymer, more preferably a conjugated polymer.

The organic semiconductor may be substituted with one or both of a substituent comprising or consisting of the first precursor unit and a substituent comprising or consisting of the second precursor unit.

If the organic semiconductor is a polymer then the components of the composition may comprise or consist of:

(i) the organic semiconductor mixed with a non-polymeric compound or a polymer comprising the first precursor unit and a non-polymeric compound or a polymer comprising the second precursor unit;

(ii) the organic semiconductor comprising a repeat unit of formula (I) comprising the first precursor unit mixed with a non-polymeric compound or a polymer comprising the second precursor unit;

(iii) the organic semiconductor comprising a repeat unit of formula (II) comprising the second precursor unit mixed with a non-polymeric compound or a polymer comprising the first precursor unit;

(iv) the organic semiconductor comprising a repeat unit of formula (I) and a repeat unit of formula (II); or (v) the organic semiconductor comprising a repeat unit of formula (VI).

It will therefore be appreciated that the components of the composition may be provided as a mixture of materials or as a single material. Preferably, the or each material is a polymer.

The organic semiconductor may comprise a polar double or triple bond, optionally a bond selected from a C=N (imino) group, a nitrile group, a C=S group, an oxime group or a C=O group, optionally a keto, ester or carbonate group. Preferably, these polar double- or triple-bond groups are conjugated to a conjugated polymer backbone. These polar double- or triple-bond groups may be provided as substituents of a conjugated repeat unit or may be part of a conjugated repeat unit, for example fluorenone.

The organic semiconductor may be a polymer comprising electron-deficient repeat units.

The organic semiconductor may comprise benzothiadiazole units. The benzothiadiazole units may be units of a polymer that is mixed with the polymer substituted with an n-dopant or a repeat unit in the backbone of the polymer substituted with an n-dopant. A polymeric repeat unit may comprise or consist of repeat units of formula:

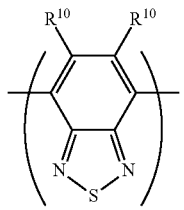

wherein $R^{10}$ in each occurrence is a substituent, optionally a substituent selected from alkyl, optionally $C_{1-20}$ alkyl, wherein one or more non-adjacent C atoms may be replaced with optionally substituted aryl or heteroaryl, O, S, C=O or —COO—, and one or more H atoms may be replaced with F.

A repeat unit comprising benzothiadiazole may have formula:

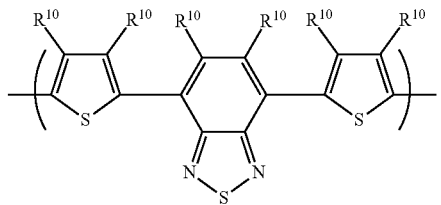

wherein $R^{10}$ is as described above with reference to benzothiadiazole.

The organic semiconductor is preferably a polymer comprising an arylene repeat unit substituted with one or more electron-withdrawing groups. Preferred arylene repeat units are $C_6$-$C_{20}$ arylene repeat units. A preferred electron-withdrawing group is cyano.

Arylene repeat units include, without limitation, fluorene, phenylene, naphthalene, anthracene, indenofluorene, phenanthrene and dihydrophenanthrene repeat units, each of which may be substituted with one or more electron-withdrawing groups, preferably cyano, and optionally substituted with one or more further substituents. Exemplary further substituents, if present, may be selected from $C_{1-40}$ hydrocarbyl. Arylene repeat units may be selected from repeat units of formulae (IX)-(XII) as described above.

A polymer comprising an electron-deficient arylene repeat unit or a benzothiadiazole repeat unit may be a copolymer comprising one or more co-repeat units. The co-repeat units may be selected from arylene co-repeat units that are not substituted with an electron-withdrawing group and are optionally unsubstituted or substituted with one or more substituents selected from $C_{1-40}$ hydrocarbyl groups where non terminal C can be replaced by O, ionic groups and substituent formulae (VII) or (VIII).

Exemplary ionic groups are groups comprising or consisting of —COO-M+ wherein M+ is an alkali cation or an ammonium cation, or groups comprising or consisting of —NR$^{11}_3$+A− wherein R$^{11}$ in each occurrence is H or $C_{1-12}$ hydrocarbyl and A− is an anion, optionally a halide or sulfonate group.

In the case where a precursor unit is a substituent of a conjugated polymer, the conjugated backbone of the polymer may form the organic semiconductor.

Polymerisation

Conjugated polymers as described herein may be formed by polymerising monomers comprising leaving groups that leave upon polymerisation of the monomers to form conjugated repeat units. Exemplary polymerization methods include, without limitation, Yamamoto polymerization as described in, for example, T. Yamamoto, "Electrically Conducting And Thermally Stable pi-Conjugated Poly(arylene)s Prepared by Organometallic Processes", Progress in Polymer Science 1993, 17, 1153-1205, the contents of which are incorporated herein by reference and Suzuki polymerization as described in, for example, WO 00/53656, WO 2003/035796, and U.S. Pat. No. 5,777,070, the contents of which are incorporated herein by reference.

Preferably, the polymer is formed by polymerising monomers comprising boronic acid or boronic ester group leaving groups bound to aromatic carbon atoms of the monomer with monomers comprising leaving groups selected from halogen, sulfonic acid or sulfonic ester, preferably bromine or iodine, bound to aromatic carbon atoms of the monomer in the presence of a palladium (0) or palladium (II) catalyst and a base.

It will be appreciated that a repeat unit of a conjugated polymer as described anywhere herein may be formed from a corresponding monomer substituted with a leaving group. The polymer may be end-capped with any suitable end-capping group. An end-capping reactant for forming the end-capping group may be added to the polymerization mixture at the outset of, during or at the end of polymerization. Exemplary end-capping groups are $C_{6-20}$ aryl groups, optionally phenyl.

Polymers as described anywhere herein, including precursor polymers and semiconductor polymers, suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of polymers described anywhere herein may be $1\times10^3$ to $1\times10^8$, and preferably $1\times10^4$ to $1\times10^7$.

Polymers as described anywhere herein are suitably amorphous polymers.

Activation

In the case where the n-dopant does not dope the organic semiconductor spontaneously, n-doping may be effected by activation. Preferably, n-doping is effected after formation of a device comprising the layer containing the organic semiconductor and n-dopant, and optionally after encapsulation. Activation may be by excitation of the n-dopant and/or the organic semiconductor.

Exemplary activation methods are thermal treatment and irradiation.

Optionally, thermal treatment is at a temperature in the range 80° C. to 170° C., preferably 120° C. to 170° C. or 130° C. to 160° C. The n-dopant reagent may spontaneously dope the organic semiconductor at the temperature used to react the precursor units in the presence of the organic semiconductor.

Thermal treatment and irradiation as described herein may be used together.

For irradiation, any wavelength of light may be used, for example a wavelength having a peak in the range of about 200-700 nm.

Optionally, the peak showing strongest absorption in the absorption spectrum of the organic semiconductor is in the range of 400-700 nm. Preferably, the strongest absorption of the n-dopant reagent is at a wavelength below 400 nm.

The present inventors have surprisingly found that exposure of a composition of an organic semiconductor and an n-dopant reagent that does not spontaneously dope the organic semiconductor to electromagnetic radiation results in n-doping and that the electromagnetic radiation need not be at a wavelength that can be absorbed by the n-dopant.

The light emitted from the light source suitably overlaps with an absorption feature, for example an absorption peak or shoulder, of the organic semiconductor's absorption spectrum. Optionally, the light emitted from the light source has a peak wavelength within 25 nm, 10 nm or 5 nm of an absorption maximum wavelength of the organic semiconductor, however it will be appreciated that a peak wavelength of the light need not coincide with an absorption maximum wavelength of the organic semiconductor.

Optionally, irradiation time is between 1 second and 1 hour, optionally between 1-30 minutes.

Preferably, the light emitted from the light source is in the range 400-700 nm. Preferably, the electromagnetic radiation has a peak wavelength greater than 400 nm, optionally greater than 420 nm, optionally greater than 450 nm. Optionally, there is no overlap between an absorption peak in the absorption spectrum of the n-dopant reagent and the wavelength(s) of light emitted from the light source.

Any suitable electromagnetic radiation source may be used to irradiate the film including, without limitation, fluorescent tube, incandescent bulb and organic or inorganic LEDs. Optionally, the electromagnetic radiation source is an array of inorganic LEDs. The electromagnetic radiation source may produce radiation having one or more than one peak wavelengths.

Preferably, the electromagnetic radiation source has a light output of at least 2000 mW, optionally at least 3000 mW, optionally at least 4000 mW.

Preferably, no more than 10% or no more than 5% of the light output of the electromagnetic radiation source is from radiation having a wavelength less than or equal to 400 nm, optionally less than or equal to 420 nm. Preferably, none of the light output has a wavelength of less than or equal to 400 nm, optionally less than or equal to 420 nm.

Inducing n-doping without exposure to short wavelength light, such as UV light, may avoid damage to the materials of the OLED.

The n-doped organic semiconductor may be an extrinsic or degenerate semiconductor.

In manufacture of an organic electronic device, such as an OLED as described in FIG. 1, activation may take place during device formation or after the device has been formed. Preferably, activation to cause n-doping takes place after the device has been formed and encapsulated. The device may be manufactured in an environment in which little or no spontaneous doping occurs, for example a room temperature environment wherein the n-dopant and organic semiconductor are exposed to little or no wavelengths of light that induce n-doping until after encapsulation of the device, for example an environment illuminated by light having a longer wavelength than that of the electromagnetic radiation source such as a clean room illuminated with yellow light.

In the case of an OLED as described in FIG. 1, a film 107 of the polymer substituted with the n-dopant and the organic semiconductor may be formed over organic light-emitting layer 105 and the cathode 109 may be formed over the film.

For activation by irradiation, the film may then irradiated through the anode 101, in the case of a device formed on a transparent substrate 101 and having a transparent anode 103, such as ITO, or the film may be irradiated through the cathode 109 in the case of a device with a transparent cathode. The wavelength used to induce n-doping may be selected to avoid wavelengths that are absorbed by layers of the device between the electromagnetic radiation source and the film.

Encapsulation

In the case where the polymer as described herein is substituted with an n-dopant that does not spontaneously dope the organic semiconductor, the n-dopant is preferably activated to cause n-doping as described herein after encapsulation of the device containing the film to prevent ingress of moisture and oxygen.

Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

The substrate on which the device is formed preferably has good barrier properties such that the substrate together with the encapsulant form a barrier against ingress of moisture or oxygen. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

Formulation Processing

Light-emitting layer 105 and electron-injecting layer 107 may be formed by any method including evaporation and solution deposition methods. Solution deposition methods are preferred.

Formulations suitable for forming light-emitting layer 105 and electron-injecting layer 107 may each be formed from the components forming those layers and one or more suitable solvents.

Preferably, light-emitting layer 105 is formed by depositing a solution in which the solvent is one or more non-polar solvent materials, optionally benzenes substituted with one or more substituents selected from $C_{1-12}$ alkyl and $C_{1-12}$ alkoxy groups, for example toluene, xylenes and methylanisoles, and mixtures thereof.

Optionally, the precursor layer, from which the electron-injecting layer 107 is formed, is deposited from a solution.

Preferably, the precursor layer is formed from a polar solvent, optionally a protic solvent, optionally water or an alcohol; dimethylsulfoxide; propylene carbonate; or 2-butanone which may avoid or minimise dissolution of the underlying layer if the materials of the underlying layer are not soluble in polar solvents.

Exemplary alcohols include methanol ethanol, propanol, butoxyethanol and monofluoro-, polyfluoro- or perfluoro-alcohols, optionally 2,2,3,3,4,4,5,5-Octafluoro-1-pentanol.

Particularly preferred solution deposition techniques including printing and coating techniques such spin-coating, inkjet printing and lithographic printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

Applications

The doped organic semiconductor layer has been described with reference to the electron-injection layer of an organic light-emitting device, however it will be appreciated that the layer formed as described herein may be used in other organic electronic device, for example as an electron-extraction layer of an organic photovoltaic device or organic photodetector; as an auxiliary electrode layer of an n-type organic thin film transistor or as an n-type semiconductor in a thermoelectric generator.

Measurements

HOMO, SOMO and LUMO levels as described anywhere herein are as measured by square wave voltammetry unless stated otherwise.

Equipment:

CHI660D Electrochemical workstation with software (IJ Cambria Scientific Ltd))

CHI 104 3 mm Glassy Carbon Disk Working Electrode (IJ Cambria Scientific Ltd))

Platinum Wire Auxiliary Electrode

Reference Electrode (Ag/AgCl) (Havard Apparatus Ltd)

Chemicals

| | |
|---|---|
| Acetonitrile (Hi-dry anhydrous grade-ROMIL) | (Cell solution solvent) |
| Toluene (Hi-dry anhydrous grade) | (Sample preparation solvent) |
| Ferrocene - FLUKA | (Reference standard) |
| Tetrabutylammonium-hexafluorophosphate- FLUKA) | (Cell solution salt) |

Sample Preparation

The acceptor polymers were spun as thin films (~20 nm) onto the working electrode; the dopant material was measured as a dilute solution (0.3 w %) in toluene.

Electrochemical Cell

The measurement cell contains the electrolyte, a glassy carbon working electrode onto which the sample is coated as a thin film, a platinum counter electrode, and a Ag/AgCl reference glass electrode. Ferrocene is added into the cell at the end of the experiment as reference material (LUMO (ferrocene)=−4.8 eV).

EXAMPLES

Model Reaction

The following reaction was performed to demonstrate that an n-dopant reagent may be formed by reaction of precursor units in a solvent-free reaction:

4-(dimethylamino)benzaldehyde (0.5 g, 3.35 mmol) and N1,N2-dimethylbenzene-1,2-diamine (0.46 g, 3.35 mmol) were placed into an oven dried 10 ml round-bottom flask under nitrogen atmosphere. Solids were heated up to 80° C. and stirred for 1 hour. Temperature was increased to 100° C. and mixture was stirred for 1 hour. A sample was analysed by $^1$H-NMR (600 MHz, CDCl$_3$).

The experiment was repeated except that the solids were heated up to 120° C. and stirred for 1 hour and a sample was analysed by $^1$H-NMR (600 MHz, CDCl$_3$). Heating was continued for a further 1 hour and a sample was analysed by $^1$H-NMR (600 MHz, CDCl$_3$).

Results are set out in Table 1

For both experiments 4-(dimethylamino)benzaldehyde and N1,N2-dimethylbenzene-1,2-diamine condense cleanly to form the n-dopant reagent in the melt.

For quantification, a singlet at 9.76 ppm was used for the aldehyde (1H) and singlet at 4.79 ppm was used for the dopant (1H).

TABLE 1

| Time and temperature | Ratio Dopant/Aldehyde | % conversion |
|---|---|---|
| 1 h at 80° C. + 1 h at 100° C. | 0.22 | 18% |
| 1 h at 120° C. | 0.57 | 36% |
| 2 h at 120° C. | 1.13 | 53% |

Precursor Monomer 1

Precursor Monomer 1 was prepared according to the following reaction scheme:

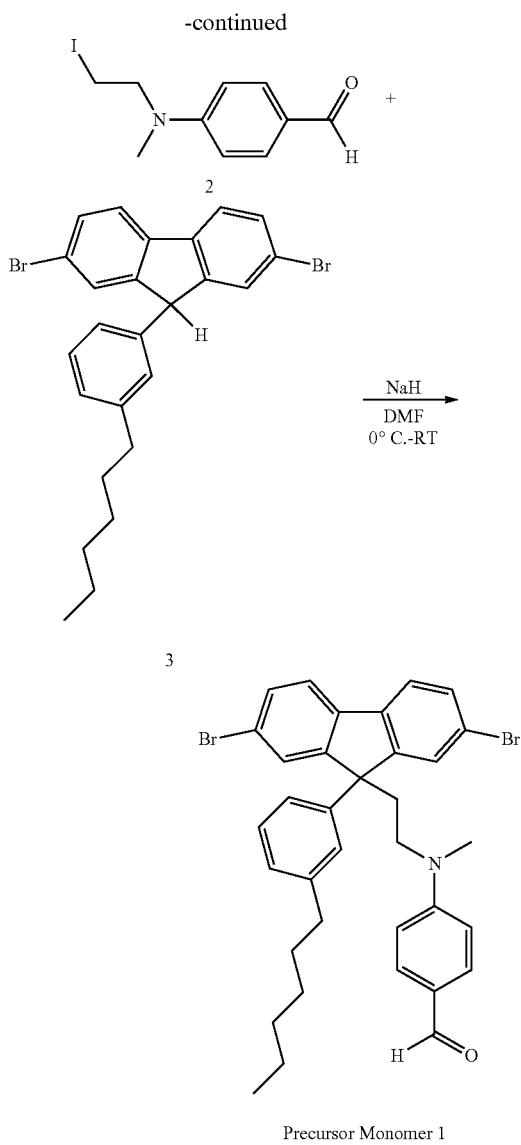

Precursor Monomer 1

¹H-NMR (300 MHz, DMSO-d6): δ [ppm] 3.06 (s, 3H), 3.35 (t, J=7.50 Hz, 2H), 3.83 (t, J=7.20 Hz, 2H), 6.83 (d, J=9.00 Hz, 2H), 7.70 (d, J=8.70 Hz, 2H), 9.69 (s, 1H).

Precursor Monomer 1:

Dimethylformamide (150 ml) was added to sodium hydride (60% in mineral oil, 4.4 g, 0.11 mol) at 0° C. Nitrogen was bubbled into a solution of intermediate 3 (45 g, 0.092 mol) in dimethylformamide (200 ml) for 30 minutes. The solution of intermediate 3 was added to the sodium hydride suspension at 0° C. and mixture was stirred 30 minutes.

Nitrogen was bubbled into a solution of intermediate 2 (45 g, 0.092 mol) in dimethylformamide (200 ml) for 30 minutes. The solution of intermediate 2 was added to the anionic mixture at 0° C. and mixture was stirred at room temperature for 16 hours. The mixture was quenched with ice water (200 ml) and extracted with ethyl acetate (400 ml×3). Combined organic layers were dried over sodium sulphate and concentrated under reduced pressure. The residue was purified by column chromatography using 8% ethyl acetate in hexane as eluent. Fractions containing product were recrystallized several times from ethyl acetate:hexane mixture to yield 15.1 g of Precursor Monomer 1 as a white solid, 99.93% pure by HPLC, 25% yield.

¹H-NMR (400 MHz, CDCl₃): δ [ppm] 0.88 (t, J=6.80 Hz, 3H), 1.28 (m, 6H), 1.54-1.52 (m, 2H), 2.53 (t, J=7.20 Hz, 2H), 2.73 (s, 4H), 2.87 (s, 3H), 6.38 (d, J=9.20 Hz, 2H), 6.86 (d, J=8.00 Hz, 1H), 6.93 (s, 1H), 7.06 (d, J=7.60 Hz, 1H), 7.15 (t, J=7.60 Hz, 1H), 7.44 (d, J=1.60 Hz, 2H), 7.57 (dd, J=8.00, 1.60 Hz, 2H), 7.64 (d, J=8.00 Hz, 2H), 7.70 (d, J=8.80 Hz, 2H), 9.74 (s, 1H).

Precursor Monomer 2

Precursor Monomer 2 was prepared according to the following reaction scheme:

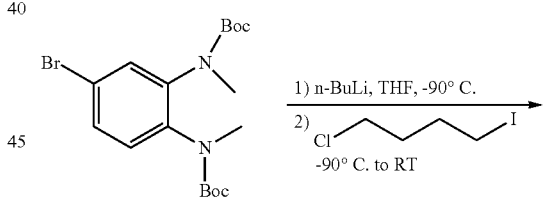

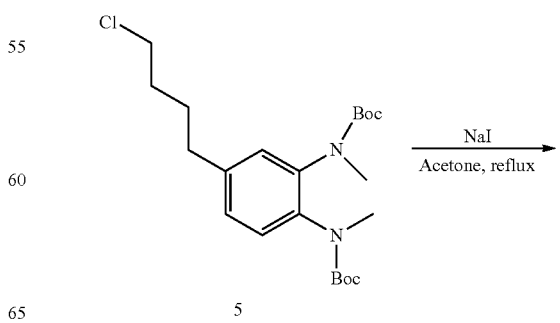

Intermediate 2:

Imidazole (21.6 g, 0.318 mol) and triphenylphosphine (83.4 g, 0.318 mol) were added to a solution of 4-((2-hydroxyethyl)(methyl)amino)benzaldehyde 1 (38 g, 0.212 mol) in dichloromethane (760 ml) at room temperature. The mixture was cooled to 0° C. and iodine (91.4 g, 0.36 mol) was added in small portions. The mixture was then stirred at room temperature for 16 hours. The reaction was quenched with 20% sodium thiosulphate solution (500 ml). The organic layer was separated and the aqueous layer was extracted with dichloromethane (200 ml×2). The combined organic layers were dried over sodium sulphate and concentrated under reduced pressure. The residue was filtered through silica gel using 20% ethyl acetate in hexane as eluent. Filtrate was concentrated under reduced pressure to give 35 g of intermediate 2, 98.50% pure by HPLC, 57% yield.

-continued

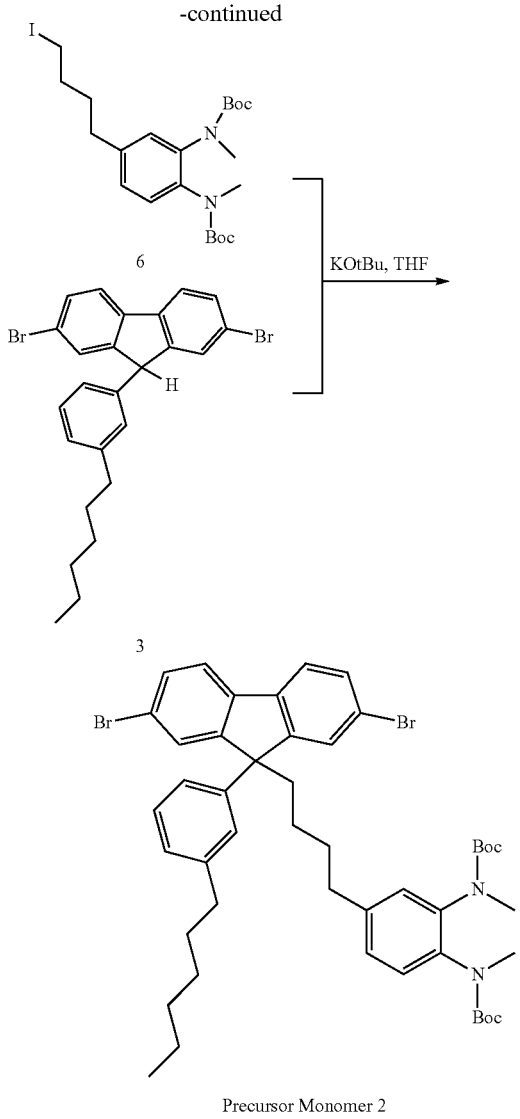

Intermediate 5:

N-butyl lithium (2.5 M in hexanes, 7.22 mmol, 2.89 ml) was added drop wise to a solution of intermediate 4 (2.000 g, 4.82 mmol) in anhydrous tetrahydrofuran (20 ml) at −90° C. The suspension was stirred at −90° C. for 2 hours. 1-chloro-4-iodobutane (14.45 mmol, 1.77 ml) was added dropwise to it at −90° C. and the mixture was allowed to warm to room temperature overnight. The mixture was cooled to −10° C. and quenched with water (5 ml). The mixture was concentrated under reduced pressure and the residue was extracted with dichloromethane (20 ml×2). The combined organic layers were washed with water (20 ml), dried over magnesium sulphate and concentrated under reduced pressure to afford 3.3 g of crude material. It was combined with the crude material from a similar reaction and purified by column chromatography on silica gel using a gradient of heptane to 20% ethyl acetate in heptane as eluent to yield 3.35 g of intermediate 5 as a mixture, 6:1.8 ratio, with di-tert-butyl 1,2-phenylenebis(methylcarbamate).

$^1$H-NMR (600 MHz, CDCl$_3$): δ$_H$ [ppm] 1.35 (s, 13H), 1.49 (br s, 10H), 1.78 (br s, 4H), 2.61 (m, 2H), 3.04-3.12 (m, 8H), 3.53 (t, J=5.8 Hz, 2H), 6.95 (br s, 0.6H), 7.03 (br s, 2H), 7.14 (br s, 0.8H), 7.23 (br s, 0.9H).

Intermediate 6:

Nitrogen was bubbled into a mixture of intermediate 5 (80 wt % assay, 2.6 g, 4.78 mmol), sodium iodide (4.35 g, 29.2 mmol) and acetone (26 ml) for 30 minutes and mixture was heated to reflux overnight. It was concentrated under reduced pressure and water (20 ml) was added to the residue. It was extracted with toluene (20 ml×2). The combined organic layers were dried over magnesium sulphate and concentrated under reduced pressure. The residue was dried in a vacuum oven at 50° C. overnight to yield 2.53 g of intermediate 6 as a mixture, 6:1.8 ratio, with di-tert-butyl 1,2-phenylenebis(methylcarbamate).

Precursor Monomer 2:

Nitrogen was bubbled into a solution of 2,7-dibromo-9-(3-hexylphenyl)-9H-fluorene 3 (3.50 g, 7.22 mmol) in anhydrous tetrahydrofuran (25 ml) for 1 hour. The solution was cooled to 10° C. and potassium tert-butoxide (0.811 g, 7.22 mmol) was added portion. The mixture was stirred for 1 hour at room temperature and cooled to 10° C. Meanwhile nitrogen was bubbled into a solution intermediate 6 (87 wt % assay, 2.53 g, 4.33 mmol) in anhydrous tetrahydrofuran (10 ml) for 1 hour. The intermediate 6 solution was added drop wise to the anion mixture and the reaction was stirred overnight. The reaction was quenched with water (10 ml) and the solvent concentrated under reduced pressure. Water was added (20 ml) and the mixture was extracted with toluene (20 ml×2). The combined organic phases were dried over magnesium sulphate and concentrated under reduced pressure. The residue was purified by column chromatography on silica gel using a gradient of heptane to 20% ethyl acetate: in dichloromethane. The residue obtained after concentration was stirred with acetonitrile (10 ml) at 50° C., cooled to room temperature, filtered and dried in a vacuum oven at 50° C. to yield 2.4 g of Precursor Monomer 2, 98.85% pure by HPLC, 63% yield.

$^1$H-NMR (600 MHz, CDCl$_3$): δ$_H$ [ppm] 0.73-0.80 (m, 2H), 0.87 (t, J=6.6 Hz, 3H), 1.25-1.35 (m, 16H), 1.45-1.56 (m, 12H), 2.35-2.47 (m, 4H), 2.53 (t, J=7.5 Hz, 2H), 3.03-3.08 (m, 6H), 6.82-6.95 (m, 4H), 6.98 (br s, 0.4H), 7.02 (d, J=7.4 Hz, 1H), 7.08 (br s, 0.6H), 1.04 (t, J=7.8 Hz, 1H), 7.31 (s, 2H), 1.99 (dd, J=8.0 Hz, J=1.7 Hz, 2H), 7.57 (d, J=8.1 Hz, 2H).

Precursor Monomer 3

Precursor Monomer 3 was prepared according to the following reaction scheme:

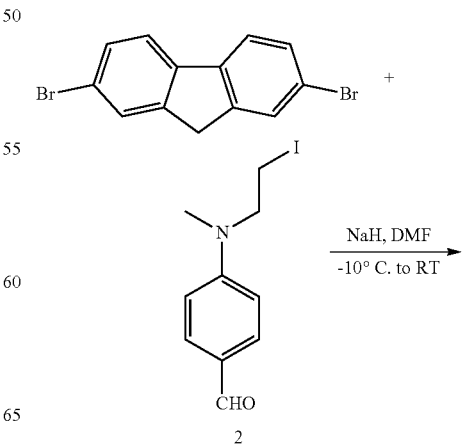

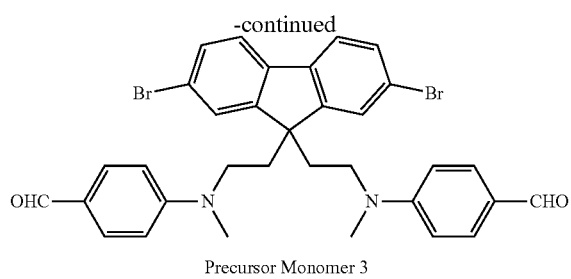

Precursor Monomer 3

Nitrogen was bubbled into dimethylformamide (170 ml) for 2 hours. It was added to sodium hydride (60% in mineral oil, 10 g, 0.2099 mol) at 0° C. A solution of 2,7-dibromofluorene 1 (17 g, 0.0525 mol) in dimethylformamide (170 ml), purged with nitrogen for 2 hours, was added to the sodium hydride suspension at 0° C. The mixture was stirred at 0° C. for 1 hour. A solution of Intermediate 2 (33.36 g, 0.1154 mol) in dimethylformamide (170 ml), purged with nitrogen for 2 hours, was added to the anionic mixture at 0° C. The mixture was allowed to warm up to room temperature and stirred for 16 hours. It was quenched with ice water (1000 ml). The slurry was filtered and solid was washed with water (500 ml). The solid was twice stirred in ethyl acetate at 60° C. and filtered to give 20 g of Precursor Monomer 3 with 97.4% HPLC purity. The solid obtained from the filtrate (9 g) was purified by column chromatography using a mixture of chloroform and ethyl acetate as eluent to give 7 g of Precursor Monomer 3 with 98.5% purity. It was recrystallized from a mixture of chloroform and hexane to give 5 g with 99.4% HPLC purity. The 20 g with 98.5% purity was purified by column chromatography using a mixture of chloroform and ethyl acetate to give 15 g with 98.9% purity. It was combined with the 5 g with 99.4% purity recrystallized from a mixture of chloroform and hexane to yield 13 g of Precursor Monomer 3, 99.77% pure by HPLC, 38% yield.

1H-NMR (400 MHz, CDCl3): δ 9.73 (s, 2H), 7.67 (d, J=8.80 Hz, 4H), 7.61 (d, J=8.0 Hz, 4H), 7.60 (s, 2H), 6.31 (d, J=9.20 Hz, 4H), 2.71 (s, 6H), 2.68 (t, J=7.60 Hz, 4H), 2.31 (t, J=6.80 Hz, 4H).

Precursor Polymer 1
Precursor Polymer 1 has the following structure:

Precursor Polymer 1 was formed by Suzuki polymerization as disclosed in WO00/53656 of 50 mol % each of the following monomers:

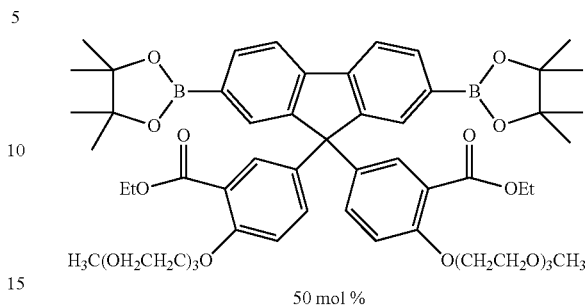

50 mol %

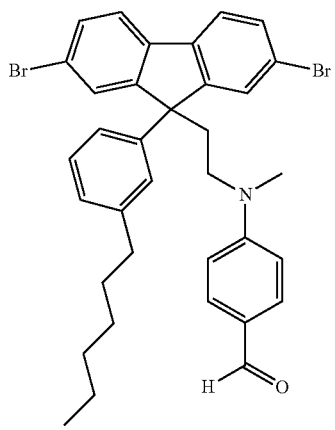

Precursor Monomer 1, 50 mol %

Precursor Polymer 1 had a Mz of 42,000, a Mw of 33,000, an Mp of 43,000, an Mn of 22,000 and a Pd of 1.51.

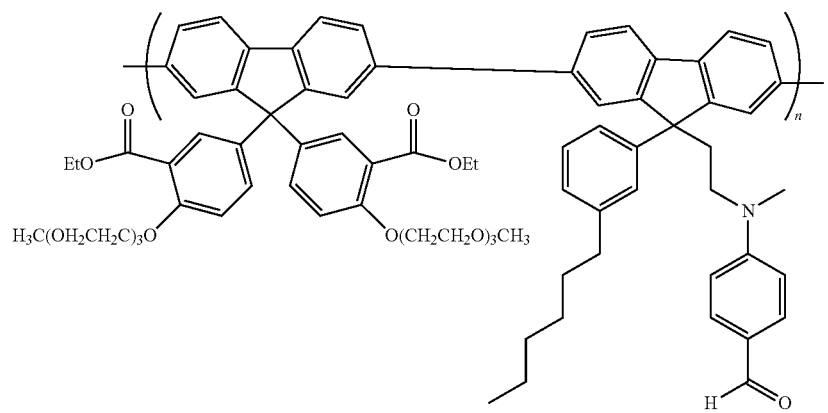

Precursor Polymer 2

Precursor Polymer 2 has the following structure:

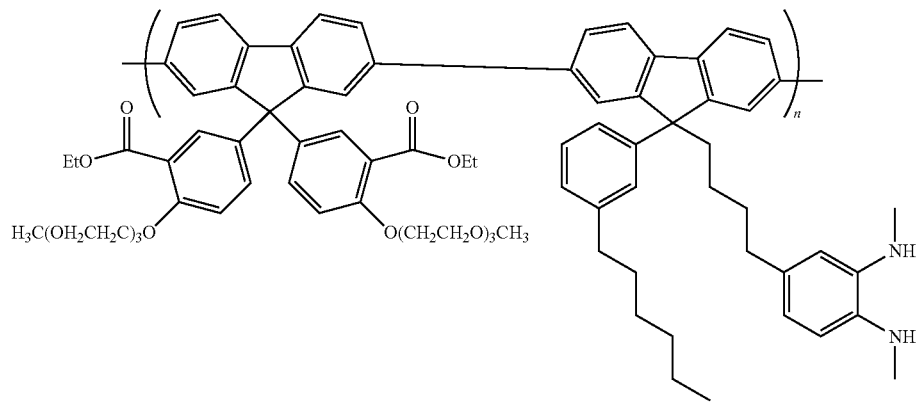

Precursor Polymer 2 was formed by Suzuki polymerization as disclosed in WO00/53656 of 50 mol % each of the following monomers to form followed by BOC-deprotection of the precursor polymer:

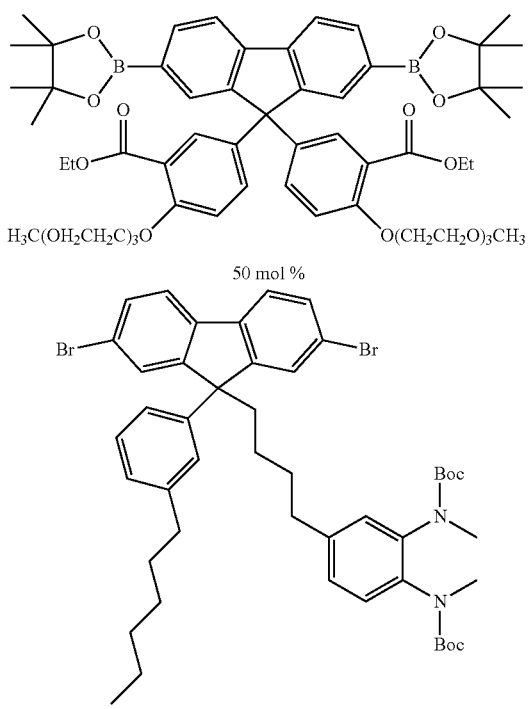

Precursor Monomer 2, 50 mol %

To deprotect the precursor polymer, nitrogen was bubbled for 30 minutes in 108 ml of chloroform, and in a mixture of 11 ml of trifluoroacetic acid and 11 ml of chloroform. 2.2 g of the precursor polymer was dissolved in the chloroform at room temperature. The polymer solution was cooled to 15° C. and the mixture of trifluoroacetic acid and chloroform was added drop wise. The mixture was stirred over night at room temperature. 165 ml of ammonium hydroxide (3% aqueous) was cooled down to 10° C. The polymer mixture was poured into it and stirred for 30 minutes. pH was adjusted to pH=9 with a few drops of HCl (10% aq) and 90 ml of chloroform was removed under reduced pressure. Mixture was added to 800 ml of methanol. The slurry was stirred for 30 minutes and filtered, Polymer cake was washed with methanol (100 ml×3). The polymer was dried in vacuum oven at 50° C. overnight to yield 2.08 g of Polymer Example 2.

The BOC-protected polymer had a Mz of 82,000, a Mw of 57,000, an Mp of 63,000, an Mn of 34,000 and a Pd of 1.69.

Precursor Polymer 2 had a Mz of 46,000, a Mw of 33,000, an Mp of 35,000, an Mn of 21,000 and a Pd of 1.61.

Device Example 1

A electron-only device having the following structure was formed:

ITO/OSC/Al wherein ITO is indium tin oxide; OSC is an organic semiconductor layer; and Al is a layer of aluminium.

To form the device, a glass substrate carrying ITO was cleaned using UV/Ozone and a layer of a mixture of Organic Semiconductor 1 (10 wt %): Precursor Polymer 1 (45 wt %): Precursor Polymer 2 (45 wt %) was deposited from 2 wt % anisole solution in a glove box and heated at 120° C. for 10 minutes to give a 120-130 nm thick layer. The silver cathode was deposited by evaporation to a thickness of about 100 nm.

A glass can was adhered to the substrate to encapsulate the device.

Organic Semiconductor 1 is a polymer formed by Suzuki polymerisation as described in WO 00/53656 of 50 mol % of a 2,7-linked fluorene repeat unit of formula (Xa) and 50 mol % of a repeat unit of formula (XIII):

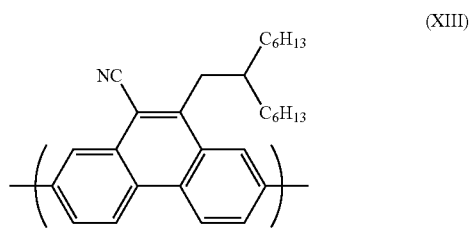

Comparative Devices 1A-1C

Comparative devices were prepared in which one or both of Precursor Polymers 1 and 2 were replaced with Inert Polymer 1, as set out in Table 1.

Inert Polymer 1, is a homopolymer of 9,9-di(n-octylphenyl)fluorene repeat units, illustrated below, which was included to keep the weight percentage of Organic Semiconductor 1 the same across all devices. Inert polymer 1 is not doped due to its shallow LUMO.

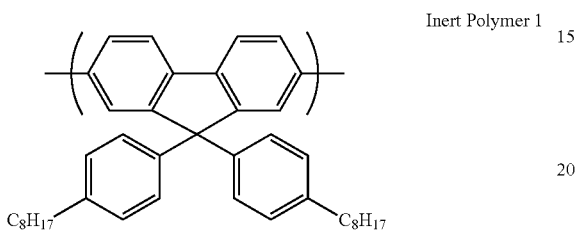

Inert Polymer 1

TABLE 2

| Polymer | HOMO (eV) | LUMO (eV) | SOMO (eV) |
|---|---|---|---|
| Dopant | −4.70 | | −2.57 |
| Inert polymer 1 | −5.85 | −2.24 | |
| Organic Semiconductor 1 | −5.5 | −2.42 | |
| Precursor Polymer 1 | −5.51 | −2.37 | |
| Precursor Polymer 2 | −4.69 eV | −2.34 eV | |

TABLE 3

| Device | Organic Semiconductor 1 (wt %) | Precursor polymer 1 (wt %) | Precursor polymer 2 (wt %) | Inert Polymer 1 (wt %) |
|---|---|---|---|---|
| Device Example 1 | 10 | 45 | 45 | — |
| Comparative Device 1A | 10 | — | — | 90 |
| Comparative Device 1B | 10 | 45 | — | 45 |
| Comparative Device 1C | 10 | — | 45 | 45 |

Figure 2:
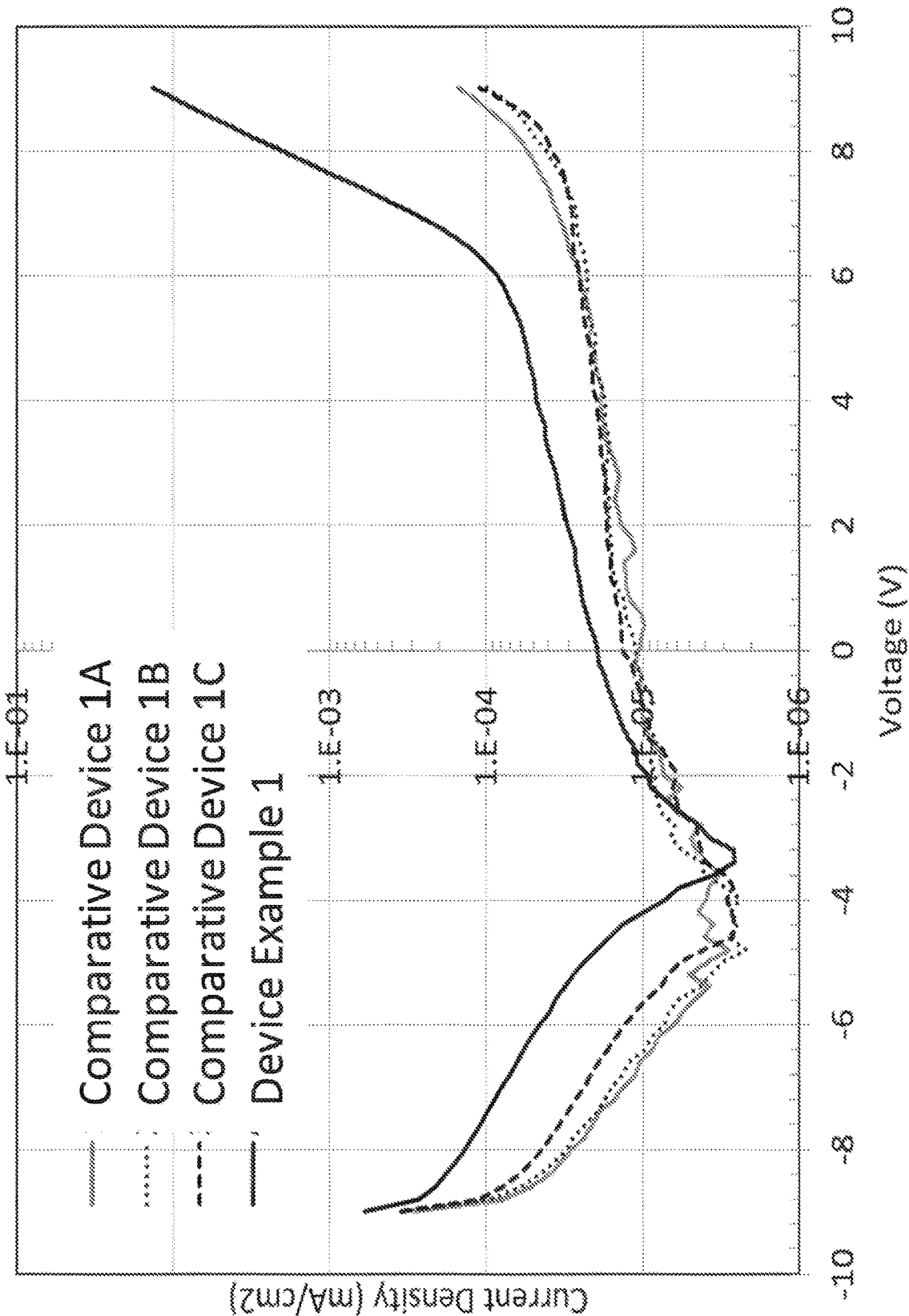
FIG. 2 is a graph of current density vs. voltage for an electron-only device according to an embodiment of the invention and three comparative devices.

With reference to FIG. 2, the current densities for Comparative Devices 1A-1C are similar, suggesting little or no doping upon mixing of Organic Semiconductor 1 with only one of Precursor Polymer 1 and Precursor Polymer 2.

In contrast, Device Example 1 shows a large increase in current density compared to the Comparative Devices, indicative of doping of Organic Semiconductor 1 by the n-dopant formed by reaction between Precursor Polymer 1 and Precursor Polymer 2.

Solution Stability

The present inventors have found that n-dopants may be susceptible to degradation in solution, for example as illustrated below:

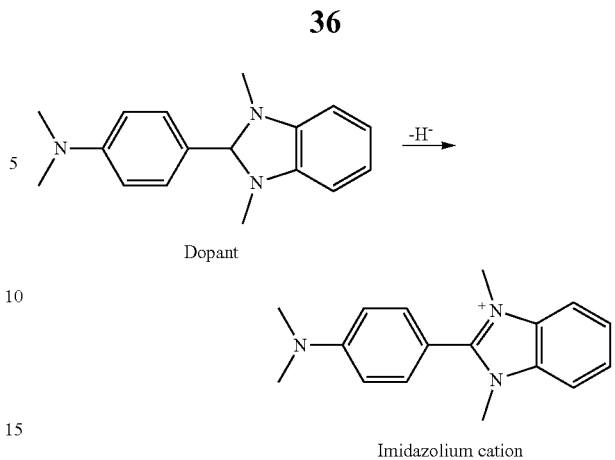

Dopant

Imidazolium cation

The stability of a solution of n-dopant in polar solvent was followed by NMR. N-dopant (6.0 mg) was dissolved in methanol-d4 (1.0 ml) and spectra were taken at different times. For quantification, a multiplet at 7.39 ppm assigned to the dopant (2H) was used and a multiplet at 7.91 ppm assigned to the imidazolium impurity (2H) was used. No other impurities were detected.

TABLE 4

| Time | Ratio Imidazolium/Dopant |
|---|---|
| 0 | 0.50% |
| 30 min | 1.25% |
| 1 h | 1.77% |
| 2 h | 2.7% |
| 4 h | 4.34% |
| 6 h | 6.0% |
| 10 h | 9.25% |
| 24 h | 18.70% |

For comparison the stability of a solution of a mixture of 4-(dimethylamino)benzaldehyde (2.5 mg) and N1,N2-dimethylbenzene-1,2-diamine (2.4 mg) dissolved in methanol-d4 was followed by NMR. Ratio of aldehyde/diamine was found to be 0.92 by NMR. Spectra were taken with the same intervals as for the n-dopant solution. Even after 24 hours, no traces of dopant could be detected, but small amount of imidazolium cation was seen. For quantification, a singlet at 9.61 ppm was used for the aldehyde (1H) and a singlet at 3.95 ppm was used for the imidazolium impurity (6H). Two unknown peaks (a singlet at 3.86 ppm and a singlet at 6.17 ppm) also developed in the solution. Intensity of the peaks are recorded in Table 5.

TABLE 5

| Time | Ratio Imidazolium/Aldehyde | 3.86 ppm | 6.17 ppm |
|---|---|---|---|
| 0 | 0% | 0% | 0% |
| 30 min | 0.02% | 0.12% | 0.06% |
| 1 h | 0.03% | 0.21% | 0.08% |
| 2 h | 0.06% | 0.43% | 0.16% |
| 4 h | 0.10% | 0.86% | 0.27% |
| 6 h | 0.14% | 1.19% | 0.40% |
| 10 h | 0.24% | 1.77% | 0.58% |
| 24 h | 0.50% | 1.44% | 0.48% |

The solution of the mixture of aldehyde and diamine in methanol-d4 is more stable than the solution of n-dopant in the same solvent.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method of forming an n-doped organic semiconductor, the method comprising:
   formation of an n-dopant reagent by reaction of a composition comprising two or more precursor units for forming the n-dopant reagent and an organic semiconductor; and
   n-doping the organic semiconductor, wherein the composition comprises a first precursor polymer comprising a repeat unit of formula (I):

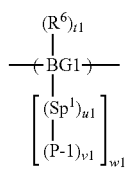

(I)

wherein BG1 is a first backbone group; $Sp^1$ is a first spacer group; P-1 is a first precursor unit; $R^6$ is a substituent; t1 is 0 or a positive integer; u1 is 0 or 1; v1 is 1 if u1 is 0; v1 is at least 1 if u1 is 1; and w1 is at least 1.

2. The method according to claim 1, wherein P-1 is a group of formula (VII):

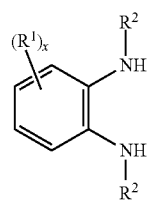

(VII)

wherein $R^1$ independently in each occurrence is a substituent; $R^2$ independently in each occurrence is H or a substituent; and x is 0, 1, 2, 3 or 4, with the proviso that one of $R^1$ and $R^2$ is a direct bond to BG1 or, if present, to $Sp^1$.

3. The method according to claim 1, wherein the first precursor polymer is a conjugated polymer.

4. The method according to claim 3, wherein BG1 is a $C_{6-20}$ arylene group.

5. The method according to claim 1, wherein the composition comprises a second precursor polymer comprising a repeat unit of formula (II):

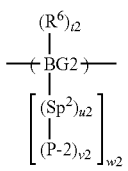

(II)

wherein BG2 is a second backbone group; $Sp^2$ is a second spacer group; P-2 is a second precursor unit; $R^6$ is a substituent; t2 is 0 or a positive integer; u2 is 0 or 1; v2 is 1 if u2 is 0; v2 is at least 1 if u2 is 1; and w2 is at least 1.

6. The method according to claim 5, wherein P-2 is a group of formula (VIII):

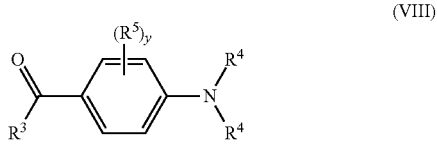

(VIII)

wherein $R^3$ and $R^4$ are each independently H or a substituent; $R^5$ independently in each occurrence is a substituent; and y is 0, 1, 2, 3 or 4, with the proviso that one of $R^3$, $R^4$ and $R^5$ is a direct bond to BG2 or, if present, to $Sp^2$.

7. The method according to claim 5, wherein the second precursor polymer is a conjugated polymer.

8. The method according to claim 1, wherein the organic semiconductor is a polymer.

9. The method according to claim 8, wherein at least one precursor unit is a substituent of the organic semiconductor polymer.

10. The method according to claim 1, wherein the composition is in the solid state at 20° C.

11. The method according to claim 1, wherein the composition is heated to form the n-dopant reagent.

12. The method according to claim 11, wherein the composition is heated to above the glass transition temperature of a polymer of the composition.

13. A method of forming an organic electronic device wherein an n-doped organic semiconductor layer of the device is formed by forming a precursor layer comprising the precursor units and the organic semiconductor according to claim 1; reacting the precursor units to form the n-dopant reagent; and n-doping the organic semiconductor.

14. The method according to claim 13, wherein the organic electronic device is an organic light-emitting device comprising an anode, a cathode, a light-emitting layer between the anode and the cathode and an electron-injection layer between the light-emitting layer and the cathode wherein the electron-injection layer is the n-doped organic semiconducting layer.

15. A composition comprising two or more precursor units for forming an n-dopant reagent and an organic semiconductor wherein the two or more precursor units and the organic semiconductor are as defined in claim 1.

16. A formulation comprising the composition according to claim 15 dissolved in a solvent.

17. A method of forming an n-doped organic semiconductor, the method comprising:
   formation of an n-dopant reagent by reaction of a first precursor unit and a second precursor unit of a precursor polymer in a composition comprising the precursor polymer and an organic semiconductor; and
   n-doping the organic semiconductor, wherein the precursor polymer comprises a repeat unit of formula (I) and a repeat unit of formula (II):

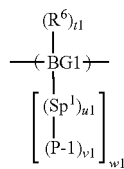

(I)

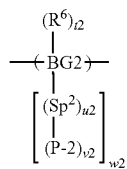

(II)

wherein BG1 is a first backbone group; $Sp^1$ is a first spacer group; P-1 is a first precursor unit; $R^6$ is a substituent; t1 is 0 or a positive integer; u1 is 0 or 1; v1 is 1 if u1 is 0; v1 is at least 1 if u1 is 1; w1 is at least 1; BG2 is a second backbone group; $Sp^2$ is a second spacer group; P-2 is a second precursor unit; $R^6$ is a substituent; t2 is 0 or a positive integer; u2 is 0 or 1; v2 is 1 if u2 is 0; v2 is at least 1 if u2 is 1; and w2 is at least 1.

18. A method of forming an n-doped organic semiconductor, the method comprising:
formation of an n-dopant reagent by reaction of a first precursor unit and a second precursor unit of a precursor polymer in a composition comprising the precursor polymer and an organic semiconductor; and
n-doping the organic semiconductor, wherein the precursor polymer comprises a repeat unit of formula (VI):

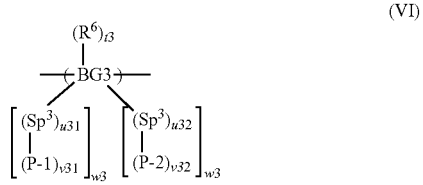

(VI)

wherein BG3 is a backbone group; P-1 is a first precursor unit; P-2 is a second precursor unit; $Sp^3$ in each occurrence is independently a spacer group; $R^6$ is a substituent; t3 is 0 or a positive integer; u31 is 0 or 1; u32 is 0 or 1; v31 is 1 if u31 is 0; v31 is at least 1 if u31 is 1; v32 is 1 if u32 is 0; v32 is at least 1 if u32 is 1; and w3 independently in each occurrence is at least 1.

* * * * *